US012660217B2

(12) United States Patent
Hou et al.

(10) Patent No.: US 12,660,217 B2
(45) Date of Patent: Jun. 16, 2026

(54) BURIED GRID DOUBLE JUNCTION BARRIER SCHOTTKY DIODE AND METHOD OF MAKING

(71) Applicant: II-VI Delaware, Inc., Wilmington, DE (US)

(72) Inventors: Shuoben Hou, Stockholm (SE); Sergey Reshanov, Stockholm (SE); Adolf Schöner, Stockholm (SE)

(73) Assignee: II-VI Delaware, Inc., Wilmington, DE (US)

( * ) Notice: Subject to any disclaimer, the term of this patent is extended or adjusted under 35 U.S.C. 154(b) by 486 days.

(21) Appl. No.: 18/303,617

(22) Filed: Apr. 20, 2023

(65) Prior Publication Data

US 2024/0355938 A1 Oct. 24, 2024

(51) Int. Cl.
H10D 8/60 (2025.01)
H10D 8/01 (2025.01)
(Continued)

(52) U.S. Cl.
CPC ............... H10D 8/60 (2025.01); H10D 8/051 (2025.01); H10D 62/8325 (2025.01); H10D 64/23 (2025.01); H10D 64/64 (2025.01)

(58) Field of Classification Search
CPC ...... H10D 8/60; H10D 8/051; H10D 62/8325; H10D 64/23; H10D 64/64; H10D 62/107
(Continued)

(56) References Cited

U.S. PATENT DOCUMENTS 6,011,279 A * 1/2000 Singh ................... H10D 12/212
257/77
6,979,863 B2 * 12/2005 Ryu ..................... H10D 84/146
438/273
(Continued)

FOREIGN PATENT DOCUMENTS

| CN | 104078515 A | 10/2014 |
|---|---|---|
| CN | 104157703 A | 11/2014 |
| CN | 112201697 A | 1/2021 |
| JP | 2006352028 A | 12/2006 |
| KR | 1020060042035 A | 5/2006 |

OTHER PUBLICATIONS

Bakowski et al., "Merits of Buried Grid Technology for SiC JBS Diodes", ECS Transactions, 2012, pp. 415-424, vol. 50:3.
(Continued)

*Primary Examiner* — Monica D Harrison
(74) *Attorney, Agent, or Firm* — The Webb Law Firm

(57) ABSTRACT

A buried grid double junction barrier Schottky diode may include a drift layer, a grid layer comprising a plurality of grid segments at least partially in the drift layer, a regrown layer on the grid layer and the drift layer, and first and second Schottky material layers. The grid segments may define at least one grid spacing area between adjacent grid segments. The first Schottky material layer may be at least partially on the regrown layer and may at least partially overlap the grid segments of the grid layer. The second Schottky material layer may be at least partially on the regrown layer and may at least partially overlap the grid spacing area(s). The second Schottky material layer may have a different Schottky barrier height than the first Schottky material layer. A method of making a buried grid double junction barrier Schottky diode is also disclosed.

20 Claims, 9 Drawing Sheets

(51) Int. Cl.
*H10D 62/832* (2025.01)
*H10D 64/23* (2025.01)
*H10D 64/64* (2025.01)

(58) Field of Classification Search
USPC ......................................................... 257/471
See application file for complete search history.

(56) References Cited

U.S. PATENT DOCUMENTS

| | | |
|---|---|---|
| 2008/0251793 A1 | 10/2008 | Mazzola et al. |
| 2011/0037139 A1* | 2/2011 | Zhao .................... H10D 62/106 |
| | | 257/E29.338 |
| 2017/0358690 A1 | 12/2017 | Saggio et al. |
| 2021/0202695 A1 | 7/2021 | Elahipanah |

OTHER PUBLICATIONS

Baliga, "A Novel Buried Grid Device Fabrication Technology", IEEE Electron Device Letters, Dec. 1980, pp. 250-252, vol. 1:12.
Lim, "Temperature-dependent characteristics of 4H-SiC Buried Grid JBS Diodes", Materials Science Forum, 2015, pp. 600-603, vol. 821-823, Trans Tech Publications Ltd, Switzerland.
Schoner, "Progress in Buried Grid Technology for Improvements in On-Resistance of High Voltage SiC Devices", ECS Transactions, 2016, pp. 183-190, vol. 75:12.
She et al., "Review of Silicon Carbide Power Devices and Their Applications", IEEE Transactions on Industrial Electronics, Oct. 2017, pp. 8193-8205, vol. 64:10.

* cited by examiner

100

1

BURIED GRID DOUBLE JUNCTION BARRIER SCHOTTKY DIODE AND METHOD OF MAKING

BACKGROUND

1. Field

This disclosed subject matter relates generally to junction barrier Schottky diodes and, in some non-limiting embodiments or aspects, to a buried grid double junction barrier Schottky diode and a method of making the same.

2. Technical Considerations

Certain diodes are particularly useful in power electronics for a wide variety of applications, such as automotive devices, photovoltaic inverters (e.g., for solar power), wind power devices, electrical power distribution, and/or the like. For example, certain diodes conduct current when voltage is applied in one direction (e.g., a forward direction, from anode to cathode, and/or the like) and block current when voltage is applied in another direction (e.g., a reverse direction, from cathode to anode, and/or the like).

However, such diodes may not perfectly block current when voltage is applied in the reverse direction. For example, such diodes may have leakage current, which may be current that leaks (e.g., is conducted in the reverse direction, from cathode to anode, and/or the like) when voltage is applied in the reverse direction. Even a small amount of leakage current may be undesirable and/or problematic, especially in high power applications (e.g., relatively high voltage, current, and/or the like). Additionally, such diodes may not perfectly conduct current when voltage is applied in the forward direction. For example, such diodes may have a threshold voltage, a forward voltage drop, an on-resistance, and/or conduction loss that are unsatisfactory (e.g., higher than desired). Moreover, adapting such diodes (e.g., changing the structure, topology, and/or materials of such diodes) to improve performance of one of blocking (e.g., when voltage is applied in the reverse direction) and/or current conducting (e.g., when voltage is applied in the forward direction) may result in reducing performance of the other (e.g., improving blocking performance may result in reducing current-conducting performance, or vice versa).

SUMMARY

Accordingly, it is an object of the presently disclosed subject matter to provide a buried grid double junction barrier Schottky diode and a method of making the same that overcome some or all of the deficiencies identified above.

According to non-limiting embodiments or aspects, provided is a buried grid double junction barrier Schottky diode. For example, the buried grid double junction barrier Schottky diode may include a drift layer, a grid layer comprising a plurality of grid segments at least partially in the drift layer, a regrown layer on the grid layer and the drift layer, a first Schottky material layer, and a second Schottky material layer. The plurality of grid segments may define at least one grid spacing area between adjacent grid segments of the plurality of grid segments. The first Schottky material layer may be at least partially on the regrown layer and/or may at least partially overlap the plurality of grid segments of the grid layer. The second Schottky material layer may be at least partially on the regrown layer and/or may at least partially overlap the at least one grid spacing area. The second Schottky material layer may have a different Schottky barrier height than the first Schottky material layer.

In some non-limiting embodiments or aspects, the buried grid double junction barrier Schottky diode may further include a substrate layer. For example, the substrate layer may be below the drift layer.

In some non-limiting embodiments or aspects, the buried grid double junction barrier Schottky diode may further include a metallization layer. For example, the substrate layer may be on the metallization layer.

In some non-limiting embodiments or aspects, the buried grid double junction barrier Schottky diode may further include a buffer layer on the substrate layer. For example, the drift layer may be on the buffer layer.

In some non-limiting embodiments or aspects, a top surface of the grid layer may be in a plane, and a top surface of the drift layer may be in the plane (e.g., the same plane). The regrown layer may be on the top surface of the grid layer and the top surface of the drift layer.

In some non-limiting embodiments or aspects, the second Schottky material layer may have a higher Schottky barrier height than the first Schottky material layer.

In some non-limiting embodiments or aspects, the first Schottky material layer may be on the second Schottky material layer, and the second Schottky material layer may be at least partially in the first Schottky material layer.

In some non-limiting embodiments or aspects, the second Schottky material layer may be on the first Schottky material layer, and the first Schottky material layer may be at least partially in the second Schottky material layer.

In some non-limiting embodiments or aspects, at least one of the first Schottky material layer or the second Schottky material layer may include an anode. Additionally or alternatively, the buried grid double junction barrier Schottky diode may further include a cathode on an opposite side of the drift layer from the anode.

In some non-limiting embodiments or aspects, the buried grid double junction barrier Schottky diode may operate in a current conducting mode when a positive voltage greater than a threshold voltage is applied from the anode to the cathode. Additionally or alternatively, the buried grid double junction barrier Schottky diode may operate in a voltage blocking mode when a negative voltage is applied from the anode to the cathode.

In some non-limiting embodiments or aspects, the buried grid double junction barrier Schottky diode may further include an anode at least partially on at least one of the first Schottky material layer or the second Schottky material layer. Additionally or alternatively, the buried grid double junction barrier Schottky diode may further include a cathode on an opposite side of the drift layer from the anode.

In some non-limiting embodiments or aspects, the first Schottky material layer may include a plurality of segments, each respective segment of the first Schottky material layer at least partially overlapping a respective grid segment of the plurality of grid segments of the grid layer.

In some non-limiting embodiments or aspects, a width of each respective segment of the first Schottky material layer may be less than a width of the respective grid segment of the plurality of grid segments of the grid layer.

In some non-limiting embodiments or aspects, a width of each respective segment of the first Schottky material layer may be greater than or equal to a width of the respective grid segment of the plurality of grid segments of the grid layer.

In some non-limiting embodiments or aspects, the at least one grid spacing area may include a plurality of grid spacing areas, and the second Schottky material layer may include a plurality of segments, each respective segment of the second Schottky material layer at least partially overlapping a respective grid spacing area of the plurality of grid spacing areas.

In some non-limiting embodiments or aspects, a width of each respective segment of the second Schottky material layer may be less than a width of the respective grid spacing area of the plurality of grid spacing areas.

In some non-limiting embodiments or aspects, the width of each respective segment of the second Schottky material layer may be greater than or equal to the width of the respective grid spacing area of the plurality of grid spacing areas.

According to non-limiting embodiments or aspects, provided is a method of making a buried grid double junction barrier Schottky diode. The method may include forming a drift layer. The method may include forming a grid layer including a plurality of grid segments at least partially in the drift layer, and the plurality of grid segments may define at least one grid spacing area between adjacent grid segments of the plurality of grid segments. The method may include forming a regrown layer on the grid layer and the drift layer. The method may include forming a first Schottky material layer at least partially on the regrown layer and at least partially overlapping the plurality of grid segments of the grid layer. The method may include forming a second Schottky material layer at least partially on the regrown layer and at least partially overlapping the at least one grid spacing area, the second Schottky material layer having a different Schottky barrier height than the first Schottky material layer.

In some non-limiting embodiments or aspects, the method may further include providing a substrate layer. In some non-limiting embodiments or aspects, the method may further include forming a buffer layer on the substrate layer. In some non-limiting embodiments or aspects, forming the drift layer may include forming the drift layer on the buffer layer.

In some non-limiting embodiments or aspects, forming the first Schottky material layer may include forming an intermediate first Schottky material layer on the regrown layer and patterning the intermediate first Schottky material layer to form the first Schottky material layer at least partially overlapping the plurality of grid segments of the grid layer. Additionally or alternatively, forming the second Schottky material layer may include forming the second Schottky material layer on the first Schottky material layer.

In some non-limiting embodiments or aspects, forming the second Schottky material layer may include forming an intermediate second Schottky material layer on the regrown layer and patterning the intermediate second Schottky material layer to form the second Schottky material layer at least partially overlapping the at least one grid spacing area. Additionally or alternatively, forming the first Schottky material layer may include forming the first Schottky material layer on the second Schottky material layer.

In some non-limiting embodiments or aspects, the method may further include forming a metallization layer on a side of the substrate layer opposite the buffer layer.

Further embodiments or aspects are set forth in the following numbered clauses:

Clause 1: A buried grid double junction barrier Schottky diode, comprising: a drift layer; a grid layer comprising a plurality of grid segments at least partially in the drift layer, the plurality of grid segments defining at least one grid spacing area between adjacent grid segments of the plurality of grid segments; a regrown layer on the grid layer and the drift layer; a first Schottky material layer at least partially on the regrown layer and at least partially overlapping the plurality of grid segments of the grid layer; and a second Schottky material layer at least partially on the regrown layer and at least partially overlapping the at least one grid spacing area, the second Schottky material layer having a different Schottky barrier height than the first Schottky material layer.

Clause 2: The buried grid double junction barrier Schottky diode of clause 1, further comprising: a substrate layer, wherein the substrate layer is below the drift layer.

Clause 3: The buried grid double junction barrier Schottky diode of clause 1 or clause 2, further comprising: a metallization layer, wherein the substrate layer is on the metallization layer.

Clause 4: The buried grid double junction barrier Schottky diode of any of clauses 1-3, further comprising: a buffer layer on the substrate layer, wherein the drift layer is on the buffer layer.

Clause 5: The buried grid double junction barrier Schottky diode of any of clauses 1-4, wherein a top surface of the grid layer is in a plane, a top surface of the drift layer is in the plane, and the regrown layer is on the top surface of the grid layer and the top surface of the drift layer.

Clause 6: The buried grid double junction barrier Schottky diode of any of clauses 1-5, wherein the second Schottky material layer has a higher Schottky barrier height than the first Schottky material layer.

Clause 7: The buried grid double junction barrier Schottky diode of any of clauses 1-6, wherein the first Schottky material layer is on the second Schottky material layer, and the second Schottky material layer is at least partially in the first Schottky material layer.

Clause 8: The buried grid double junction barrier Schottky diode of any of clauses 1-7, wherein the second Schottky material layer is on the first Schottky material layer, and the first Schottky material layer is at least partially in the second Schottky material layer.

Clause 9: The buried grid double junction barrier Schottky diode of any of clauses 1-8, wherein at least one of the first Schottky material layer or the second Schottky material layer comprises an anode, the buried grid double junction barrier Schottky diode further comprising: a cathode on an opposite side of the drift layer from the anode.

Clause 10: The buried grid double junction barrier Schottky diode of any of clauses 1-9, wherein the buried grid double junction barrier Schottky diode operates in a current conducting mode when a positive voltage greater than a threshold voltage is applied from the anode to the cathode, and wherein the buried grid double junction barrier Schottky diode operates in a voltage blocking mode when a negative voltage is applied from the anode to the cathode.

Clause 11: The buried grid double junction barrier Schottky diode of any of clauses 1-10, further comprising: an anode at least partially on at least one of the first Schottky material layer or the second Schottky material layer; and a cathode on an opposite side of the drift layer from the anode.

Clause 12: The buried grid double junction barrier Schottky diode of any of clauses 1-11, wherein the first Schottky material layer comprises a plurality of segments, each respective segment of the first Schottky material layer at least partially overlapping a respective grid segment of the plurality of grid segments of the grid layer.

Clause 13: The buried grid double junction barrier Schottky diode of any of clauses 1-12, wherein a width of each respective segment of the first Schottky material layer is less than a width of the respective grid segment of the plurality of grid segments of the grid layer.

Clause 14: The buried grid double junction barrier Schottky diode of any of clauses 1-13, wherein a width of each respective segment of the first Schottky material layer is greater than or equal to a width of the respective grid segment of the plurality of grid segments of the grid layer.

Clause 15: The buried grid double junction barrier Schottky diode of any of clauses 1-14, wherein the at least one grid spacing area comprises a plurality of grid spacing areas, and wherein the second Schottky material layer comprises a plurality of segments, each respective segment of the second Schottky material layer at least partially overlapping a respective grid spacing area of the plurality of grid spacing areas.

Clause 16: The buried grid double junction barrier Schottky diode of any of clauses 1-15, wherein one of: a width of each respective segment of the second Schottky material layer is less than a width of the respective grid spacing area of the plurality of grid spacing areas, or the width of each respective segment of the second Schottky material layer is greater than or equal to the width of the respective grid spacing area of the plurality of grid spacing areas.

Clause 17: A method of making a buried grid double junction barrier Schottky diode, comprising: forming a drift layer; forming a grid layer comprising a plurality of grid segments at least partially in the drift layer, the plurality of grid segments defining at least one grid spacing area between adjacent grid segments of the plurality of grid segments; forming a regrown layer on the grid layer and the drift layer; forming a first Schottky material layer at least partially on the regrown layer and at least partially overlapping the plurality of grid segments of the grid layer; and forming a second Schottky material layer at least partially on the regrown layer and at least partially overlapping the at least one grid spacing area, the second Schottky material layer having a different Schottky barrier height than the first Schottky material layer.

Clause 18: The method of clause 17, further comprising: providing a substrate layer; and forming a buffer layer on the substrate layer, wherein forming the drift layer comprises forming the drift layer on the buffer layer.

Clause 19: The method of clause 17 or clause 18, wherein forming the first Schottky material layer comprises: forming an intermediate first Schottky material layer on the regrown layer; and patterning the intermediate first Schottky material layer to form the first Schottky material layer at least partially overlapping the plurality of grid segments of the grid layer, wherein forming the second Schottky material layer comprises forming the second Schottky material layer on the first Schottky material layer.

Clause 20: The method of any of clauses 17-19, wherein forming the second Schottky material layer comprises: forming an intermediate second Schottky material layer on the regrown layer; and patterning the intermediate second Schottky material layer to form the second Schottky material layer at least partially overlapping the at least one grid spacing area, wherein forming the first Schottky material layer comprises forming the first Schottky material layer on the second Schottky material layer.

Clause 21: The method of any of clauses 17-20, further comprising: forming a metallization layer on a side of the substrate layer opposite the buffer layer.

These and other features and characteristics of the presently disclosed subject matter, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosed subject matter. As used in the specification and the claims, the singular forms of "a," "an," and "the" include plural referents unless the context clearly dictates otherwise.

BRIEF DESCRIPTION OF THE DRAWINGS

Additional advantages and details of the disclosed subject matter are explained in greater detail below with reference to the exemplary embodiments or aspects that are illustrated in the accompanying figures, in which.

DESCRIPTION

Figure 1A:
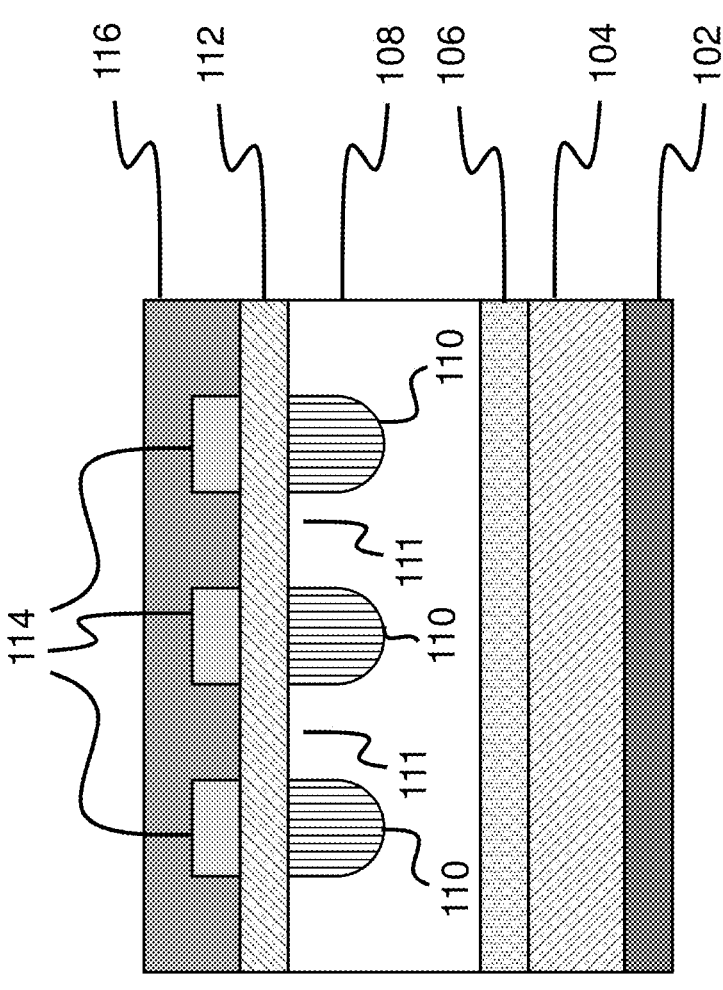
FIGS. 1A and 1B are diagrams of exemplary buried grid double junction barrier Schottky diodes, according to some non-limiting embodiments or aspects of the presently disclosed subject matter.

For purposes of the description hereinafter, the terms "end," "upper," "lower," "right," "left," "vertical," "horizontal," "top," "bottom," "lateral," "longitudinal," and derivatives thereof shall relate to the disclosed subject matter as it is oriented in the drawing figures. However, it is to be understood that the disclosed subject matter may assume various alternative variations and step sequences, except where expressly specified to the contrary. It is also to be understood that the specific devices and processes illustrated in the attached drawings, and described in the following specification, are simply exemplary embodiments or aspects of the disclosed subject matter. Hence, specific dimensions and other physical characteristics related to the embodiments or aspects disclosed herein are not to be considered as limiting unless otherwise indicated.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise.

Some non-limiting embodiments or aspects are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Non-limiting embodiments or aspects of the disclosed subject matter are directed to a buried grid double junction barrier Schottky diode and a method of making the same. For example, non-limiting embodiments or aspects of the disclosed subject matter provide a buried grid double junction barrier Schottky diode, which may include a drift layer, a grid layer, a regrown layer, a first Schottky material layer, and a second Schottky material layer. The grid layer may include a plurality of grid segments at least partially in the drift layer, and the grid segments may define at least one grid spacing area between adjacent grid segments. The regrown layer may be on the grid layer and the drift layer. The first Schottky material layer may be at least partially on the regrown layer and/or may at least partially overlap the grid segments of the grid layer. The second Schottky material layer may be at least partially on the regrown layer and/or may at least partially overlap the grid spacing area(s). The second Schottky material layer may have a different Schottky barrier height than the first Schottky material layer. Such embodiments or aspects provide a diode with two different Schottky contact materials (e.g., a double junction) arranged to improve at least one of blocking performance and/or current-conducting performance (e.g., while also maintaining and/or improving the other). For example, the first Schottky material layer (e.g., with a lower Schottky barrier height) at least partially overlapping the grid segments of the grid layer improves current conducting (e.g., when voltage is applied in the forward direction) by reducing the threshold voltage, the forward voltage drop, the on-resistance, and/or the conduction loss, and the second Schottky material layer (e.g., with a higher Schottky barrier height) at least partially overlapping the grid spacing area(s) maintains and/or improves blocking performance (e.g., when voltage is applied in the reverse direction) by having similar or reduced leakage current and/or similar or increased breakdown voltage (e.g., compared to a diode having a single Schottky material layer).

For the purpose of illustration, in the following description, while the presently disclosed subject matter is described with respect to junction barrier Schottky diodes, e.g., a buried grid double junction barrier Schottky diode and a method of making the same, one skilled in the art will recognize that the disclosed subject matter is not limited to the illustrative embodiments or aspects. For example, the systems and methods described herein may be used with a wide variety of settings, such as semiconductor devices in any setting in which current conducting in one direction and voltage blocking in another direction may be useful, such as diodes, rectifiers, transistors, integrated circuits, and/or the like.

Figure 1B:
Figure 1B:
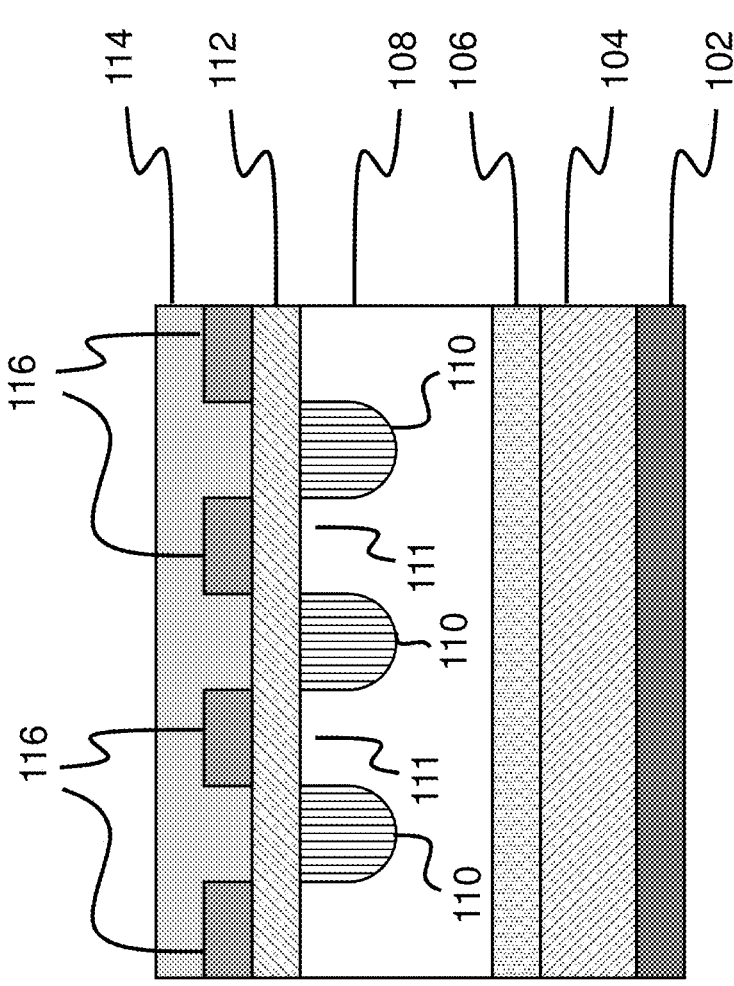

Referring now to FIGS. 1A and 1B, FIGS. 1A and 1B are diagrams of exemplary buried grid double junction barrier Schottky diodes, according to some non-limiting embodiments or aspects of the presently disclosed subject matter. As shown in FIGS. 1A and 1B, buried grid double junction barrier Schottky diode 100 may include at least one of metallization layer 102, substrate layer 104, buffer layer 106, drift layer 108, grid layer 110, grid spacing areas 111, regrown layer 112, first Schottky material layer 114, second Schottky material layer 116, and/or any combination thereof.

Metallization layer 102 may include a layer of metal material and/or other conductive material. For example, the metal and/or conductive material of metallization layer 102 may include a layer of aluminum (Al), silver (Ag), gold (Au), copper (Cu), titanium (Ti), nickel (Ni), an alloy of at least two metals, a compound including at least one metal, polysilicon, silicide, ohmic contact (e.g., silicidation), any combination thereof, and/or the like. For example, ohmic contact (e.g., silicidation) may be formed by depositing a thin layer of nickel (Ni) followed by annealing (e.g., thermal annealing, laser annealing, and/or the like) to form a nickel silicide layer. Additionally or alternatively, metal and/or conductive material (e.g., as described above) may be deposited on the nickel silicide layer.

Substrate layer 104 may include a layer of material on (e.g., above, in contact with, and/or the like) metallization layer 102. For example, substrate layer 104 may include a layer of an n-type (e.g., lightly n-doped) semiconductor material, such as silicon carbide (SiC), silicon (Si), a compound including at least one semiconductor material, any combination thereof, and/or the like. Additionally or alternatively, substrate layer 104 may include a layer of highly conductive material (e.g., semiconductor material, metal material, any combination thereof, and/or the like).

Buffer layer 106 may include a layer of material on (e.g., above, in contact with, and/or the like) substrate layer 104. Additionally or alternatively, buffer layer 106 may be above (and/or on and/or in contact with) metallization layer 102. In some non-limiting embodiments or aspects, buffer layer 106 may include a layer of an n$^+$-type (e.g., highly n-doped) semiconductor material, such as silicon carbide (SiC), silicon (Si), a compound including at least one semiconductor material, any combination thereof, and/or the like. Additionally or alternatively, buffer layer 106 may include a layer of material with the same type of doping as substrate layer 104. In some non-limiting embodiments or aspects, buffer layer 106 may include an epitaxial buffer layer.

Drift layer 108 may include a layer of material on (e.g., above, in contact with, and/or the like) buffer layer 106. Additionally or alternatively, drift layer 108 may be above (and/or on and/or in contact with) buffer layer 106, substrate layer 104, and/or metallization layer 102. In some non-limiting embodiments or aspects, buffer layer 106 may include a layer of an n-type (e.g., lightly n-doped) semiconductor material, such as silicon carbide (SiC), silicon (Si), a compound including at least one semiconductor material, any combination thereof, and/or the like. Additionally or alternatively, drift layer 108 may include a layer of material with the same type of doping as substrate layer 104 and/or buffer layer 106. In some non-limiting embodiments or aspects, drift layer 108 may include an epitaxial drift layer.

Grid layer 110 may include a plurality of grid segments at least partially in (e.g., embedded in, in contact with, and/or the like) drift layer 108. As shown in FIGS. 1A and 1B, grid layer 110 includes three grid segments, but any suitable number of grid segments may be included. In some non-limiting embodiments or aspects, the grid segments of grid layer 110 may have a repeating structure in at least one direction. For example, the grid segments may have a repeating structure in a first direction, and the repeating structure may repeat with a regular distance in at least the first direction (e.g., grid segments shaped like bars of identical and/or substantially similar size are spaced apart by grid spacing areas 111 of identical and/or substantially similar size in the first direction). Additionally or alternatively, the grid segments may have a repeating structure in both a first direction and a second direction (e.g., instead of bars spaced linearly in one direction, the grid segments may be squares, circles, hemispheres, and/or any other suitable shape spaced apart by first grid spacing areas 111 of first identical and/or substantially similar size in the first direction and spaced apart by second grid spacing areas 111 of second identical and/or substantially similar size, wherein the first and second grid spacing areas 111 may be the same or different size). In some non-limiting embodiments or aspects, the plurality of grid segments may define at least one grid spacing area 111 between adjacent grid segments. As shown in FIGS. 1A and 1B, two grid spacing areas 111 are shown between the three grid segments, but any suitable number of grid spacing areas may be included (e.g., based on the number of grid segments). In some non-limiting embodiments or aspects, grid layer 110 may include a p-type (e.g., lightly p-doped) and/or $p^+$-type (e.g., highly p-doped) semiconductor material, such as silicon carbide (SIC), silicon (Si), a compound including at least one semiconductor material, any combination thereof, and/or the like. Additionally or alternatively, grid layer 110 may include a layer of material with an opposite type of doping as substrate layer 104, buffer layer 106, and/or drift layer 108. In some non-limiting embodiments or aspects, grid layer 110 may include a layer of material with a higher doping level than drift layer 108.

Regrown layer 112 may include a layer of material on (e.g., above, in contact with, and/or the like) drift layer 108 and/or grid layer 110. For example, a top surface of grid layer 110 may be in a plane, a top surface of drift layer 108 may be in the plane (e.g., the top surfaces of grid layer 110 and drift layer 108 may be in the same plane), and regrown layer 112 may be on (e.g., above, in contact with, and/or the like) the top surfaces of the grid layer and the drift layer (e.g., on the plane). In some non-limiting embodiments or aspects, regrown layer 112 may include a layer of an n-type (e.g., lightly n-doped) semiconductor material, such as silicon carbide (SiC), silicon (Si), a compound including at least one semiconductor material, any combination thereof, and/or the like. Additionally or alternatively, regrown layer 112 may include a layer of material with the same type of doping as substrate layer 104, buffer layer 106, and/or drift layer 108. In some non-limiting embodiments or aspects, regrown layer 112 may include an epitaxial regrown layer.

First Schottky material layer 114 may include a layer of material at least partially overlapping (e.g., above and/or the like) the grid segments of grid layer 110. For example, first Schottky material layer 114 may be at least partially on (e.g., above, in contact with, and/or the like) regrown layer 112. In some non-limiting embodiments or aspects, first Schottky material layer 114 may include a metal material and/or other conductive material. For example, first Schottky material layer 114 may include a layer of titanium (Ti), titanium disulfide ($TiS_2$), Titanium nitride (TiN), Tungsten silicide ($WSi_2$), polysilicon, silicide, an alloy of at least two metals, a compound including at least one metal (e.g., a compound of at least one semiconductor material and at least one metal material), any combination thereof, and/or the like. In some non-limiting embodiments or aspects, first Schottky material layer 114 may be surface treated to adjust (e.g., reduce and/or the like) the Schottky barrier height thereof. For example, surface treatment of first Schottky material layer 114 may include at least one of annealing, temperature treatment, ion sputtering, any combination thereof, and/or the like.

Second Schottky material layer 116 may include a layer of material at least partially overlapping (e.g., above and/or the like) the grid spacing area(s) 111. For example, second Schottky material layer 116 may be at least partially on (e.g., above, in contact with, and/or the like) regrown layer 112. In some non-limiting embodiments or aspects, second Schottky material layer 116 may include a metal material and/or other conductive material. For example, second Schottky material layer 116 may include a layer of titanium (Ti), titanium disulfide ($TiS_2$), Titanium nitride (TiN), Tungsten silicide ($WSi_2$), polysilicon, silicide, an alloy of at least two metals, a compound including at least one metal (e.g., a compound of at least one semiconductor material and at least one metal material), any combination thereof, and/or the like. In some non-limiting embodiments or aspects, second Schottky material layer 116 may be surface treated to adjust (e.g., increase and/or the like) the Schottky barrier height thereof. For example, surface treatment of second Schottky material layer 116 may include at least one of annealing, temperature treatment, ion sputtering, any combination thereof, and/or the like.

In some non-limiting embodiments or aspects, second Schottky material layer 116 may have a different (e.g., higher, greater, and/or the like) Schottky barrier height than first Schottky material layer 114. For example, second Schottky material layer 116 may include a different material than first Schottky material layer 114 (e.g., the different materials may have different Schottky barrier heights). Additionally or alternatively, second Schottky material layer 116 may be surface treated differently than first Schottky material layer 114 (e.g., even if first Schottky material layer 114 and second Schottky material layer 116 include the same material, first Schottky material layer 114 and second Schottky material layer 116 may have different Schottky barrier heights if first Schottky material layer 114 and second Schottky material layer 116 received different surface treatments). For example, first Schottky material layer 114 may be surface treated to reduce the Schottky barrier height thereof, and second Schottky material layer 116 may be surface treated to increase the Schottky barrier height thereof. In some non-limiting embodiments or aspects, first Schottky material layer 114 and second Schottky material layer 116 may include different materials and may have received different surface treatments.

In some non-limiting embodiments or aspects, second Schottky material layer 116 may have a higher Schottky barrier height than first Schottky material layer 114. For example, first Schottky material layer 114 may include a lower Schottky barrier height material (LSBM), and second Schottky material layer 116 may include a higher Schottky barrier height material (HSBM), as described herein. For example, the LSBM may have a Schottky barrier height of 1 electron volt (eV) or less, and the HSBM may have a Schottky barrier height of 1.2 eV or more (e.g., 1.22 eV or more).

In some non-limiting embodiments or aspects, first Schottky material layer 114 may be on (e.g., formed on top of and/or the like) second Schottky material layer 116, and second Schottky material layer 116 may be at least partially in first Schottky material layer 114 (e.g., as shown in FIG. 1B). For example, second Schottky material layer 116 may include a plurality of segments, and each respective segment of second Schottky material layer 116 may at least partially overlap a respective grid spacing area 111 of the grid spacing area(s) 111 defined between grid segments of grid layer 110 (e.g., as shown in FIG. 1B). In some non-limiting embodiments or aspects, a width of each respective segment of second Schottky material layer 116 may be greater than or equal to the width of the respective grid spacing area 111. Alternatively, the width of each respective segment of second Schottky material layer 116 may be less than a width of the respective grid spacing area 111.

In some non-limiting embodiments or aspects, second Schottky material layer 116 may be on (e.g., formed on top of and/or the like) first Schottky material layer 114, and first Schottky material layer 114 may be at least partially in second Schottky material layer 116 (e.g., as shown in FIG. 1A). For example, first Schottky material layer 114 may include a plurality of segments, and each respective segment of first Schottky material layer 114 may at least partially overlap a respective grid segment of grid layer 110 (e.g., as shown in FIG. 1A). In some non-limiting embodiments or aspects, a width of each respective segment of first Schottky material layer 114 may be less than a width of the respective grid segment of grid layer 110. Alternatively, a width of each respective segment of first Schottky material layer 114 may be greater than or equal to a width of the respective grid segment of grid layer 110.

In some non-limiting embodiments or aspects, at least one of first Schottky material layer 114 or second Schottky material layer 116 (e.g., whichever of these two layers is on top) may include (e.g., may serve as) an anode. Additionally or alternatively, an additional layer of metal material (not pictured) may be deposited on first Schottky material layer 114 or second Schottky material layer 116 (e.g., whichever of these two layers is on top) to serve as an anode. In some non-limiting embodiments or aspects, buried grid double junction barrier Schottky diode 100 may include a cathode on an opposite side of drift layer 108 from the anode. For example, metallization layer 102 may include (e.g., may serve as) a cathode.

In some non-limiting embodiments or aspects, buried grid double junction barrier Schottky diode 100 may operate in a current conducting mode when a voltage (e.g., positive voltage) greater than a threshold voltage (VTH) is applied from the anode to the cathode (e.g., voltage is applied in the forward direction). Additionally or alternatively, buried grid double junction barrier Schottky diode 100 may operate in a blocking mode (e.g., voltage blocking mode) when a voltage (e.g., positive voltage) is applied from the cathode to the anode (e.g., voltage is applied in the forward direction, negative voltage is applied from the anode to the cathode, and/or the like).

The number and arrangement of layers and/or elements in FIGS. 1A and 1B are provided as an example. There may be additional layers and/or elements, fewer layers and/or elements, different layers and/or elements, and/or differently arranged layers and/or elements than those shown in FIGS.

1A and 1B. Furthermore, two or more layers and/or elements shown in FIGS. 1A and 1B may be implemented within a single layer and/or element, or a single layer and/or element shown in FIGS. 1A and 1B may be implemented as multiple layers and/or elements. Additionally or alternatively, a set of layers and/or set of elements of buried grid double junction barrier Schottky diode 100 may perform one or more functions described as being performed by another set of layers and/or another set of elements of buried grid double junction barrier Schottky diode 100. The doping of materials and/or layers described with respect to FIGS. 1A and 1B are provided as an example. There may be additional doping, less doping, and/or different doping than those described above. For example, all n-type and/or $n^+$-type materials may be interchanged for p-type and/or $p^+$-type, respectively, and vice versa (e.g., and the buried grid double junction barrier Schottky diode may still operate as described herein). For example, substrate layer 104 may be p-type, buffer layer 106 may be $p^+$-type, drift layer 108 may be p-type, grid layer 110 may be n-type and/or $n^+$-type, and/or regrown layer 112 may be p-type.

Figure 2:
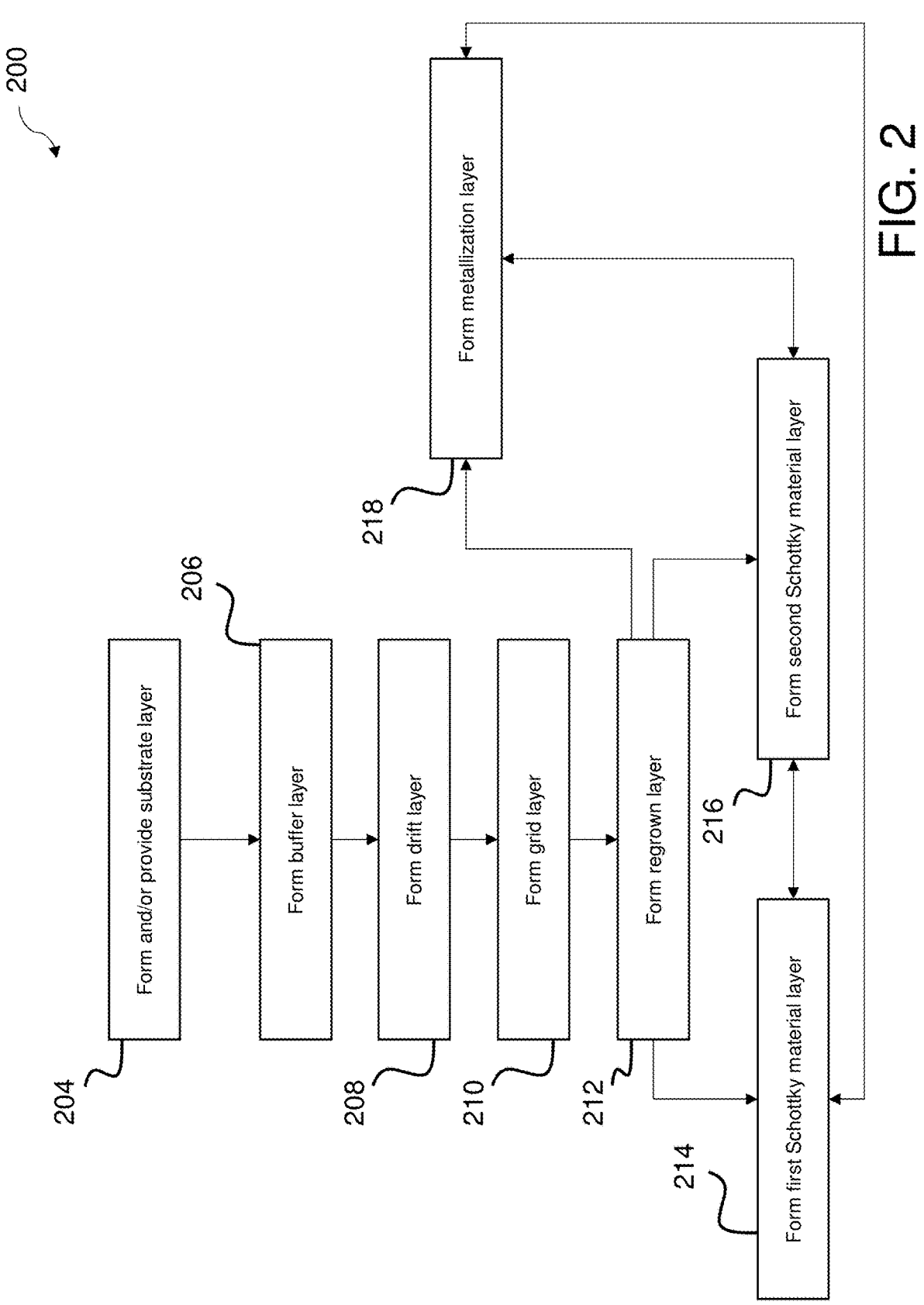
FIG. 2 is a flowchart of an exemplary method of making a buried grid double junction barrier Schottky diode, according to some non-limiting embodiments or aspects of the presently disclosed subject matter.

Referring now to FIG. 2, FIG. 2 is a flowchart of an exemplary process 200 of making a buried grid double junction barrier Schottky diode, according to some non-limiting embodiments or aspects of the presently disclosed subject matter. The number and arrangement of steps shown in FIG. 2 are provided as an example. In some non-limiting embodiments or aspects, process 200 may include additional steps, fewer steps, different steps, or differently arranged steps than those shown in FIG. 2.

As shown in FIG. 2, at step 204, process 200 may include forming and/or providing a substrate layer. For example, substrate layer 104 may be provided (e.g., may have been previously fabricated) as a layer of semiconductor material (e.g., n-type semiconductor material) upon which the other layers of buried grid double junction barrier Schottky diode 100 may be formed. Additionally or alternatively, substrate layer 104 may be formed. For example, substrate layer 104 may be formed by forming a crystal of semiconductor material, slicing the crystal to form a wafer, and/or doping the crystal and/or the wafer to form substrate layer 104.

In some non-limiting embodiments or aspects, substrate layer 104 may be doped (e.g., lightly n-doped) after forming substrate layer 104. Additionally or alternatively, substrate layer 104 (and/or the material thereof) may be doped before and/or during providing and/or forming substrate layer 104.

As shown in FIG. 2, at step 206, process 200 may include forming a buffer layer. For example, buffer layer 106 may be formed on one side (e.g., a top side, opposite side from metallization layer 102, and/or the like) of substrate layer 104. In some non-limiting embodiments or aspects, forming buffer layer 106 may include depositing a layer of semiconductor material (e.g., $n^+$-type semiconductor material) on one side of substrate layer 104. For example, depositing may include adhering buffer layer 106 to substrate layer 104, affixing buffer layer 106 to substrate layer 104, forming buffer layer 106 by epitaxy (e.g., epitaxial growth) on substrate layer 104, any combination thereof, and/or the like.

In some non-limiting embodiments or aspects, buffer layer 106 may be doped (e.g., highly n-doped) after forming buffer layer 106. Additionally or alternatively, buffer layer 106 (and/or the material thereof) may be doped before and/or during forming (e.g., depositing) buffer layer 106.

As shown in FIG. 2, at step 208, process 200 may include forming a drift layer. For example, drift layer 108 may be formed on one side (e.g., a top side, opposite side from metallization layer 102, and/or the like) of buffer layer 106.

In some non-limiting embodiments or aspects, forming drift layer 108 may include depositing a layer of semiconductor material (e.g., n-type semiconductor material) on one side of buffer layer 106. For example, depositing may include adhering drift layer 108 to buffer layer 106, affixing drift layer 108 to buffer layer 106, forming drift layer 108 by epitaxy (e.g., epitaxial growth) on buffer layer 106, any combination thereof, and/or the like.

In some non-limiting embodiments or aspects, drift layer 108 may be doped (e.g., lightly n-doped) after forming drift layer 108. Additionally or alternatively, drift layer 108 (and/or the material thereof) may be doped before and/or during forming (e.g., depositing) drift layer 108.

As shown in FIG. 2, at step 210, process 200 may include forming a grid layer. For example, grid layer 110 may be formed by patterning (e.g., by etching, lift-off, and/or the like) drift layer 108 to form a plurality of trenches and/or forming grid segments of grid layer 110 in the trenches. In some non-limiting embodiments or aspects, forming the grid segments of grid layer 110 may include depositing semiconductor material (e.g., p-type and/or p⁺-type semiconductor material) in the trenches of drift layer 108. For example, depositing may include adhering the grid segments into the trenches, affixing the grid segments into the trenches, forming the grid segments by epitaxy (e.g., epitaxial growth) in the trenches, any combination thereof, and/or the like. In some non-limiting embodiments or aspects, forming grid layer 110 may include forming the grid segments of grid layer 110 by implantation.

In some non-limiting embodiments or aspects, the grid segments of grid layer 110 may be doped (e.g., lightly p-doped, highly p-doped, and/or the like) after forming the grid segments of grid layer 110. Additionally or alternatively, the grid segments of grid layer 110 (and/or the material thereof) may be doped before and/or during forming (e.g., depositing) the grid segments of grid layer 110.

As shown in FIG. 2, at step 212, process 200 may include forming a regrown layer. For example, regrown layer 112 may be formed on drift layer 108 and/or grid layer 110. In some non-limiting embodiments or aspects, forming regrown layer 112 may include depositing a layer of semiconductor material (e.g., n-type semiconductor material) on top of drift layer 108 and/or grid layer 110. For example, depositing may include adhering regrown layer 112 to drift layer 108 and/or grid layer 110, affixing regrown layer 112 to drift layer 108 and/or grid layer 110, forming regrown layer 112 by epitaxy (e.g., epitaxial growth) on drift layer 108 and/or grid layer 110, any combination thereof, and/or the like.

In some non-limiting embodiments or aspects, regrown layer 112 may be doped (e.g., lightly n-doped) after forming regrown layer 112. Additionally or alternatively, regrown layer 112 (and/or the material thereof) may be doped before and/or during forming (e.g., depositing) regrown layer 112.

As shown in FIG. 2, at step 214, process 200 may include forming a first Schottky material layer. For example, first Schottky material layer 114 may be formed at least partially on (e.g., above, in contact with, and/or the like) regrown layer 112 and/or at least partially overlapping (e.g., above and/or the like) the grid segments of grid layer 110. In some non-limiting embodiments or aspects, forming first Schottky material layer 114 may include depositing a layer of metal material and/or other conductive material on regrown layer 112 (and/or second Schottky material layer 116). For example, depositing may include sputtering first Schottky material layer 114 onto regrown layer 112 (and/or second Schottky material layer 116), depositing first Schottky material layer 114 onto regrown layer 112 (and/or second Schottky material layer 116) by evaporation, adhering first Schottky material layer 114 to regrown layer 112 (and/or second Schottky material layer 116), affixing first Schottky material layer 114 to regrown layer 112 (and/or second Schottky material layer 116), forming first Schottky material layer 114 by chemical vapor deposition (CVD) on regrown layer 112 (and/or second Schottky material layer 116), any combination thereof, and/or the like.

In some non-limiting embodiments or aspects, first Schottky material layer 114 may be surface treated after forming first Schottky material layer 114. Additionally or alternatively, first Schottky material layer 114 (and/or the material thereof) may be surface treated before and/or during forming (e.g., depositing) first Schottky material layer 114.

In some non-limiting embodiments or aspects, forming first Schottky material layer 114 may include forming an intermediate first Schottky material layer on regrown layer 112 (e.g., depositing a layer of metal material and/or other conductive material on regrown layer 112). The intermediate first Schottky material layer may be patterned (e.g., by etching, lift-off, and/or the like) to form first Schottky material layer 114 at least partially overlapping the grid segments of grid layer 110 (e.g., to form a plurality of segments of first Schottky material layer 114, each respective segment at least partially overlapping a respective grid segment of grid layer 110). (For example, after forming first Schottky material layer 114 by patterning the intermediate first Schottky material layer, second Schottky material layer 116 may be formed on first Schottky material layer 114 and/or regrown layer 112.)

As shown in FIG. 2, at step 216, process 200 may include forming a second Schottky material layer. For example, second Schottky material layer 116 may be formed at least partially on (e.g., above, in contact with, and/or the like) regrown layer 112 and/or at least partially overlapping (e.g., above and/or the like) grid spacing area(s) 111. In some non-limiting embodiments or aspects, forming second Schottky material layer 116 may include depositing a layer of metal material and/or other conductive material on regrown layer 112 (and/or first Schottky material layer 114). For example, depositing may include sputtering second Schottky material layer 116 onto regrown layer 112 (and/or first Schottky material layer 114), depositing second Schottky material layer 116 onto regrown layer 112 (and/or first Schottky material layer 114) by evaporation, adhering second Schottky material layer 116 to regrown layer 112 (and/or first Schottky material layer 114), affixing second Schottky material layer 116 to regrown layer 112 (and/or first Schottky material layer 114), forming second Schottky material layer 116 by CVD on regrown layer 112 (and/or first Schottky material layer 114), any combination thereof, and/or the like.

In some non-limiting embodiments or aspects, second Schottky material layer 116 may be surface treated after forming second Schottky material layer 116. Additionally or alternatively, second Schottky material layer 116 (and/or the material thereof) may be surface treated before and/or during forming (e.g., depositing) second Schottky material layer 116.

In some non-limiting embodiments or aspects, forming second Schottky material layer 116 may include forming an intermediate second Schottky material layer on regrown layer 112 (e.g., depositing a layer of metal material and/or other conductive material on regrown layer 112). The intermediate second Schottky material layer may be patterned (e.g., by etching, lift-off, and/or the like) to form second Schottky material layer 116 at least partially overlapping the grid spacing area(s) 111 (e.g., to form a plurality of segments of second Schottky material layer 116, each respective segment at least partially overlapping a respective grid spacing area 111). (For example, after forming second Schottky material layer 116 by patterning the intermediate second Schottky material layer, first Schottky material layer 114 may be formed on second Schottky material layer 116 and/or regrown layer 112.)

In some non-limiting embodiments or aspects, step 216 may come before step 214 (e.g., second Schottky material layer 116 may be formed initially, and first Schottky material layer 114 may be formed thereon). In some non-limiting embodiments or aspects, step 216 may come after step 214 (e.g., first Schottky material layer 114 may be formed initially, and second Schottky material layer 116 may be formed thereon).

As shown in FIG. 2, at step 218, process 200 may include forming metallization layer. For example, metallization layer 102 may be formed on one side (e.g., a bottom side; opposite side from buffer layer 106, drift layer 108, grid layer 110, regrown layer 112, first Schottky material layer 114, and/or second Schottky material layer 116; and/or the like) of substrate layer 104. For example, substrate layer 104 may be formed and/or provided (e.g., may have been previously fabricated), as described herein, and forming metallization layer 102 may include depositing the layer of metal material and/or other conductive material on one side of substrate layer 104. For example, depositing may include sputtering metallization layer 102 onto substrate layer 104, depositing metallization layer 102 onto substrate layer 104 by evaporation, adhering metallization layer 102 to substrate layer 104, affixing metallization layer 102 to substrate layer 104, forming metallization layer 102 by CVD on substrate layer 104, any combination thereof, and/or the like.

In some non-limiting embodiments or aspects, ohmic contact (e.g., silicidation) may be formed by depositing a thin layer of nickel (Ni) followed by annealing (e.g., thermal annealing, laser annealing, and/or the like) to form a nickel silicide layer. Additionally or alternatively, metal and/or conductive material (e.g., as described above) may be deposited on the nickel silicide layer to form metallization layer 102.

In some non-limiting embodiments or aspects, step 218 may come after step 204 (e.g., substrate layer 104 may be formed and/or provided, and metallization layer 102 may be formed thereon). In some non-limiting embodiments or aspects, step 218 may come after step 212, step 214, and/or step 216, as described herein.

Figure 3A:
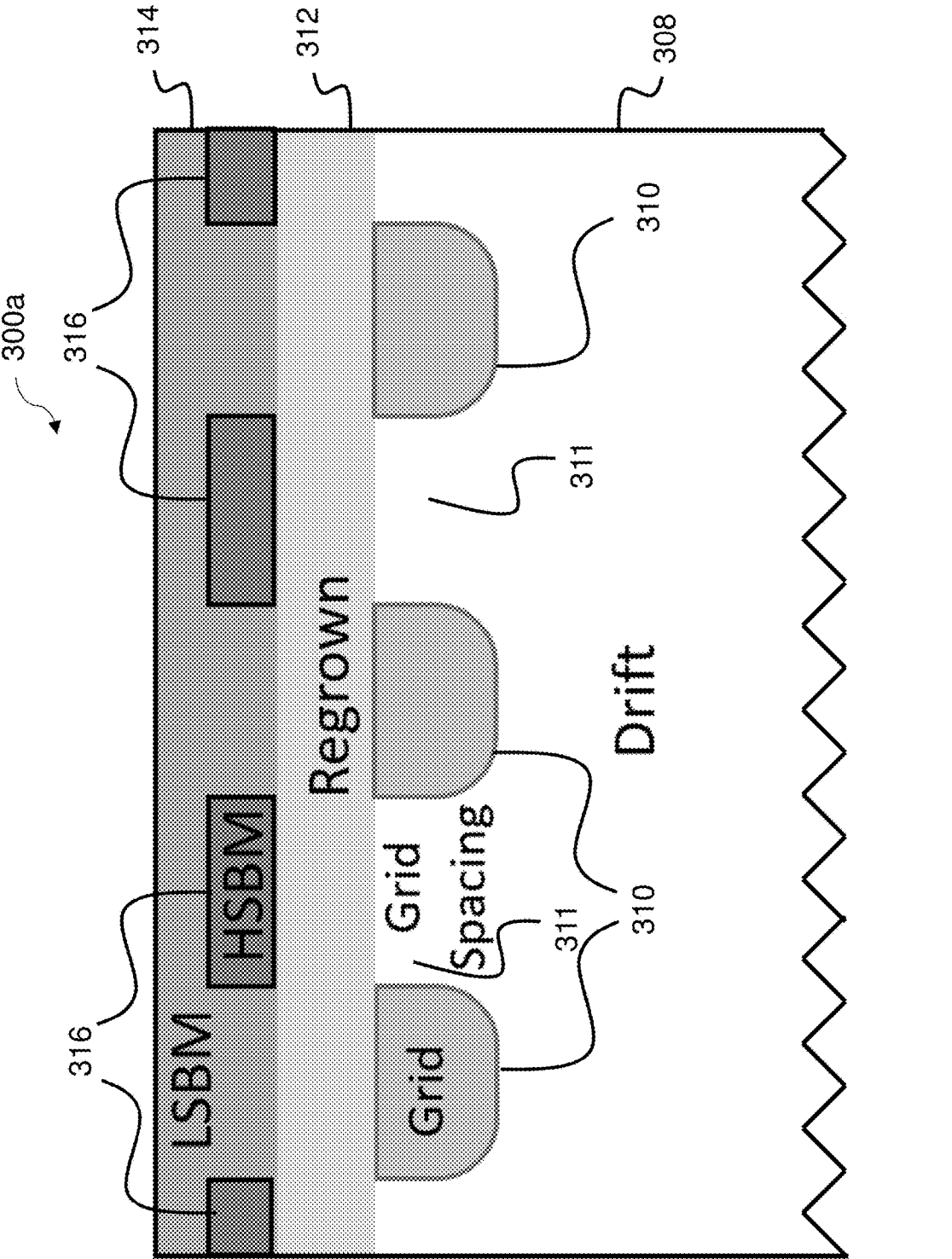
FIGS. 3A and 3B are diagrams of exemplary implementations of a buried grid double junction barrier Schottky diode, according to some non-limiting embodiments or aspects of the presently disclosed subject matter.

Referring now to FIG. 3A, FIG. 3A is a diagram of an exemplary implementation 300a of a buried grid double junction barrier Schottky diode, according to some non-limiting embodiments or aspects of the presently disclosed subject matter. As shown in FIG. 3A, implementation 300a may include at least one of drift layer 308, grid layer 310, grid spacing areas 311, regrown layer 312, LSBM layer 314, HSBM layer 316, and/or any combination thereof. In some non-limiting embodiments or aspects, implementation 300a may be the same as or similar to buried grid double junction barrier Schottky diode 100. In some non-limiting embodiments or aspects, drift layer 308 may be the same as or similar to drift layer 108. In some non-limiting embodiments or aspects, grid layer 310 may be the same as or similar to grid layer 110. In some non-limiting embodiments or aspects, grid spacing areas 311 may be the same as or similar to grid spacing areas 111. In some non-limiting embodiments or aspects, regrown layer 312 may be the same as or similar to regrown layer 112. In some non-limiting embodiments or aspects, LSBM layer 314 may be the same as or similar to first Schottky material layer 114. In some non-limiting embodiments or aspects, HSBM layer 316 may be the same as or similar to second Schottky material layer 116. The number and arrangement of layers and/or elements in FIG. 3A are provided as an example. There may be additional layers and/or elements, fewer layers and/or elements, different layers and/or elements, and/or differently arranged layers and/or elements than those shown in FIG. 3A. Furthermore, two or more layers and/or elements shown in FIG. 3A may be implemented within a single layer and/or element, or a single layer and/or element shown in FIG. 3A may be implemented as multiple layers and/or elements. Additionally or alternatively, a set of layers and/or set of elements of implementation 300a may perform one or more functions described as being performed by another set of layers and/or another set of elements of implementation 300a. In some non-limiting embodiments or aspects, implementation 300a may include at least one additional layer below drift layer 308, such as a metallization layer, a substrate layer, a buffer layer, any combination thereof, and/or the like.

In some non-limiting embodiments or aspects, LSBM layer 314 may be on (e.g., formed on top of and/or the like) HSBM layer 316, and HSBM layer 316 may be at least partially in LSBM layer 314, as described herein. For example, HSBM layer 316 may include a plurality of segments, and each respective segment of HSBM layer 316 may at least partially overlap a respective grid spacing area 311 of the grid spacing area(s) 311 defined between grid segments of grid layer 310, as described herein. In some non-limiting embodiments or aspects, a width of each respective segment of HSBM layer 316 may be greater than or equal to the width of the respective grid spacing area 311. Alternatively, the width of each respective segment of HSBM layer 316 may be less than a width of the respective grid spacing area 311.

Figure 3B:
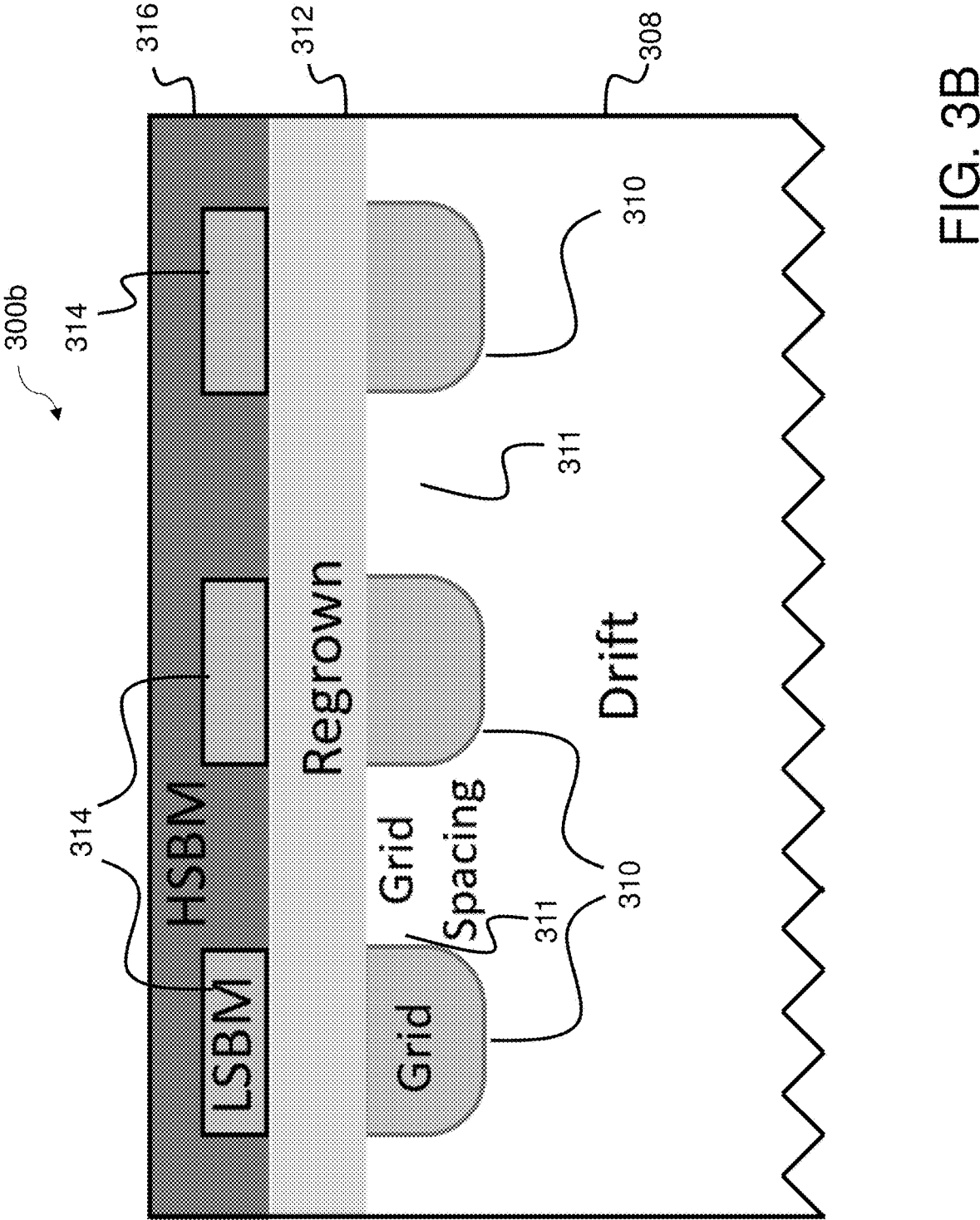

Referring now to FIG. 3B, FIG. 3B is a diagram of an exemplary implementation 300b of a buried grid double junction barrier Schottky diode, according to some non-limiting embodiments or aspects of the presently disclosed subject matter. As shown in FIG. 3B, implementation 300b may include at least one of drift layer 308, grid layer 310, grid spacing areas 311, regrown layer 312, LSBM layer 314, HSBM layer 316, and/or any combination thereof. In some non-limiting embodiments or aspects, implementation 300b may be the same as or similar to buried grid double junction barrier Schottky diode 100. In some non-limiting embodiments or aspects, drift layer 308 may be the same as or similar to drift layer 108. In some non-limiting embodiments or aspects, grid layer 310 may be the same as or similar to grid layer 110. In some non-limiting embodiments or aspects, grid spacing areas 311 may be the same as or similar to grid spacing areas 111. In some non-limiting embodiments or aspects, regrown layer 312 may be the same as or similar to regrown layer 112. In some non-limiting embodiments or aspects, LSBM layer 314 may be the same as or similar to first Schottky material layer 114. In some non-limiting embodiments or aspects, HSBM layer 316 may be the same as or similar to second Schottky material layer 116. The number and arrangement of layers and/or elements in FIG. 3B are provided as an example. There may be additional layers and/or elements, fewer layers and/or elements, different layers and/or elements, and/or differently arranged layers and/or elements than those shown in FIG. 3B. Furthermore, two or more layers and/or elements shown in FIG.

3B may be implemented within a single layer and/or element, or a single layer and/or element shown in FIG. 3B may be implemented as multiple layers and/or elements. Additionally or alternatively, a set of layers and/or set of elements of implementation 300b may perform one or more functions described as being performed by another set of layers and/or another set of elements of implementation 300b. In some non-limiting embodiments or aspects, implementation 300b may include at least one additional layer below drift layer 308, such as a metallization layer, a substrate layer, a buffer layer, any combination thereof, and/or the like.

In some non-limiting embodiments or aspects, HSBM layer 316 may have a higher Schottky barrier height than LSBM layer 314, as described herein.

In some non-limiting embodiments or aspects, HSBM layer 316 may be on (e.g., formed on top of and/or the like) LSBM layer 314, and LSBM layer 314 may be at least partially in HSBM layer 316, as described herein. For example, LSBM layer 314 may include a plurality of segments, and each respective segment of LSBM layer 314 may at least partially overlap a respective grid segment of grid layer 310, as described herein. In some non-limiting embodiments or aspects, a width of each respective segment of LSBM layer 314 may be less than a width of the respective grid segment of grid layer 310. Alternatively, a width of each respective segment of LSBM layer 314 may be greater than or equal to a width of the respective grid segment of grid layer 310.

With continued reference to FIGS. 3A and 3B, implementation 300a and/or implementation 300b may improve performance of the diode (e.g., compared to a diode having a single Schottky material layer) by lowering a threshold voltage (VTH), improving (e.g., reducing) on-resistance, and maintaining and/or improving voltage blocking capabilities. For example, implementation 300a and/or implementation 300b may include semiconductor material layers of silicon carbide (SiC) and a buried grid (BG) junction barrier Schottky (JBS) structure with double Schottky contact materials. In some non-limiting embodiments or aspects, an LSBM may be (at least partially) implemented above grid segments of grid layer 310 to reduce the threshold voltage (VTH), and/or an HSBM may be (at least partially) implemented above grid spacing area(s) 311 to maintain and/or improve the blocking voltage (e.g., maintain and/or increase the blocking voltage) and leakage current (e.g., maintain and/or reduce the leakage current).

In some non-limiting embodiments or aspects, one or more suitable Schottky materials (e.g., titanium or a compound including titanium) may be used to form a barrier at the surface of the SiC layers (e.g., regrown layer 312, grid layer 310, and/or drift layer 308), and this may result in low forward voltage drop ($V_F$) and low leakage current. Additionally, a thin regrown layer 312 between grid layer 310 and the Schottky material(s) may shield the Schottky contact areas from high electric fields in blocking mode, which may result in reduced leakage current.

In some non-limiting embodiments or aspects, having two different Schottky material layers (e.g., LSBM layer 314 and HSBM layer 316) on regrown layer 312 may reduce on-resistance and/or conduction loss. For example, LSBM layer 314 may be (at least partially) implemented at the areas above grid segments of grid layer 310, and HSBM layer 316 may be (at least partially) implemented at the areas above the grid spacing areas 311. In blocking mode, HSBM layer 316 may maintain and/or improve the leakage current (e.g., reduce the leakage current) and breakdown voltage (e.g., increase the breakdown voltage). In current conducting mode, LSBM layer 314 may start conducting earlier (e.g., at a lower voltage), resulting in a lower threshold voltage (VTH), a lower forward voltage drop ($V_F$), and lower conduction loss (e.g., especially under low load conditions).

Figure 4:
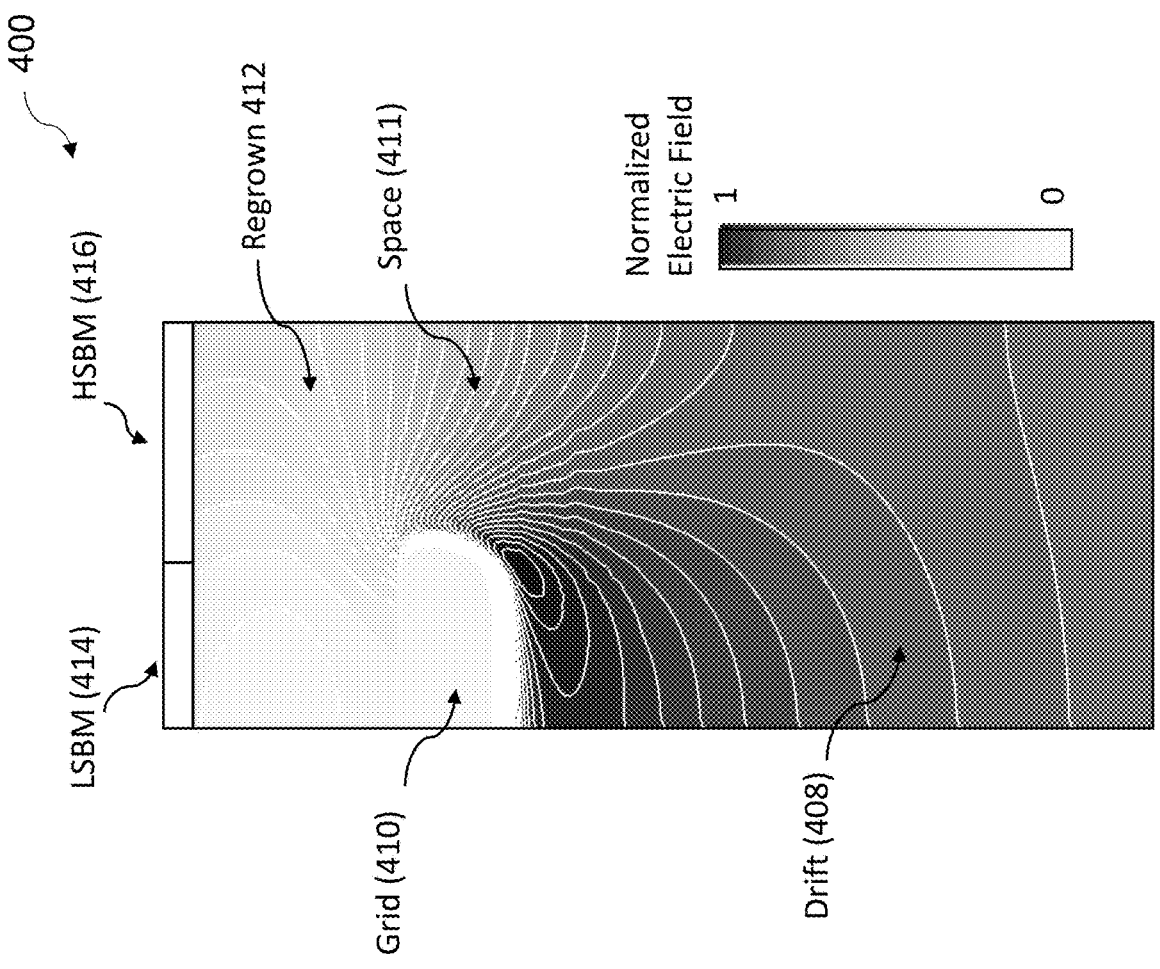
FIG. 4 is a diagram of a normalized electric field of an exemplary implementation of a buried grid double junction barrier Schottky diode, according to some non-limiting embodiments or aspects of the presently disclosed subject matter.

Referring now to FIG. 4, FIG. 4 is a diagram of normalized electric field of an exemplary implementation 400 of a buried grid double junction barrier Schottky diode (e.g., in blocking mode), according to some non-limiting embodiments or aspects of the presently disclosed subject matter. As shown in FIG. 4, implementation 400 may include drift layer 408, grid layer 410, grid spacing areas 411, regrown layer 412, LSBM layer 414, and HSBM layer 416. In some non-limiting embodiments or aspects, implementation 400 may be the same as or similar to buried grid double junction barrier Schottky diode 100, implementation 300a, and/or implementation 300b. In some non-limiting embodiments or aspects, drift layer 408 may be the same as or similar to drift layer 108 and/or drift layer 308. In some non-limiting embodiments or aspects, grid layer 410 may be the same as or similar to grid layer 110 and/or grid layer 310. In some non-limiting embodiments or aspects, grid spacing areas 411 may be the same as or similar to grid spacing areas 111 and/or grid spacing areas 311. In some non-limiting embodiments or aspects, regrown layer 412 may be the same as or similar to regrown layer 112 and/or regrown layer 312. In some non-limiting embodiments or aspects, LSBM layer 414 may be the same as or similar to first Schottky material layer 114 and/or LSBM layer 314. In some non-limiting embodiments or aspects, HSBM layer 416 may be the same as or similar to second Schottky material layer 116 and/or HSBM layer 316. The number and arrangement of layers and/or elements in FIG. 4 are provided as an example. There may be additional layers and/or elements, fewer layers and/or elements, different layers and/or elements, and/or differently arranged layers and/or elements than those shown in FIG. 4. Furthermore, two or more layers and/or elements shown in FIG. 4 may be implemented within a single layer and/or element, or a single layer and/or element shown in FIG. 4 may be implemented as multiple layers and/or elements. Additionally or alternatively, a set of layers and/or set of elements of implementation 400 may perform one or more functions described as being performed by another set of layers and/or another set of elements of implementation 400. In some non-limiting embodiments or aspects, implementation 400 may include at least one additional layer below drift layer 408, such as a metallization layer, a substrate layer, a buffer layer, any combination thereof, and/or the like.

As shown in FIG. 4, in blocking mode, there is a higher electric field below the grid segment of grid layer 410 than above. This may demonstrate that LSBM layer 414 above grid layer 410 may not affect the blocking capabilities of the diode (e.g., HSBM layer 316 allows the diode to maintain the blocking capabilities despite the inclusion of LSBM layer 314, even though a material with lower Schottky barrier height may otherwise be expected to reduce blocking capabilities).

For the purpose of illustration and not limitation, as shown in FIG. 4, the electric field may be lowest in grid layer 410 and relatively low in the portion of regrown layer 412 above grid layer 410 and below LSBM layer 314. The electric field may be relatively higher in the portion of regrown layer 412 above grid spacing area 411 and below HSBM layer 416. The electric field may be even higher in grid spacing area 411 and the portion of drift layer 408 below grid spacing area 411. The electric field may be highest in the portion of drift layer 408 below grid layer 410.

In some non-limiting embodiments or aspects, there may be no electric field in LSBM layer 414 and/or HSBM layer 416.

Figure 5A:
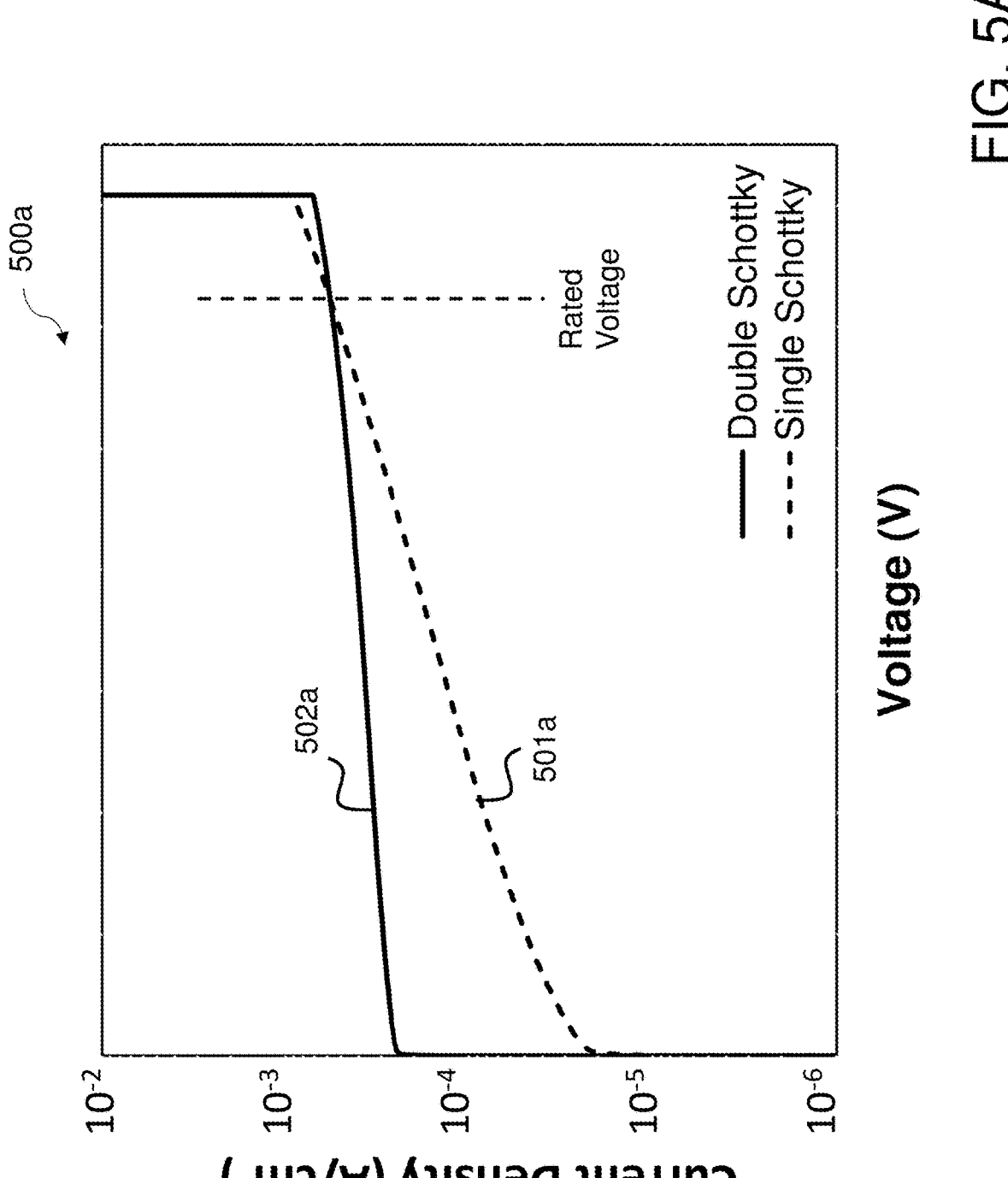
FIG. 5A is a graph of reverse current density and voltage of an exemplary implementation of a buried grid double junction barrier Schottky diode, according to some non-limiting embodiments or aspects of the presently disclosed subject matter.

Referring now to FIG. 5A, FIG. 5A shows graph 500*a* of reverse current density and voltage of an exemplary implementation of a buried grid double junction barrier Schottky diode, according to some non-limiting embodiments or aspects of the presently disclosed subject matter. As shown in FIG. 5A, graph 500*a* may include a vertical axis of current density (J) (e.g., in amperes per square centimeter (A/cm²)) and a horizontal axis of voltage (e.g., in volts (V)). Additionally, the vertical axis may include a logarithmic scale.

As shown in FIG. 5A, first curve 501*a* may represent a buried grid junction barrier Schottky diode with a single Schottky material layer, and second curve 502*a* may represent a buried grid double junction barrier Schottky diode (e.g., with two Schottky material layers with different Schottky barrier heights), as described herein. At or above the voltage rating, second curve 502*a* may demonstrate the same or lower reverse current density (e.g., the same or reduced leakage current) compared to first curve 501*a*. Even at lower voltages, second curve 502*a* may demonstrate comparable reverse current density (e.g., maintain leakage current) compared to first curve 501*a*.

Figure 5B:
FIG. 5B is a graph of forward current density and voltage of an exemplary implementation of a buried grid double junction barrier Schottky diode, according to some non-limiting embodiments or aspects of the presently disclosed subject matter.

Referring now to FIG. 5B, FIG. 5B shows graph 500*b* of forward current density and voltage of an exemplary implementation of a buried grid double junction barrier Schottky diode, according to some non-limiting embodiments or aspects of the presently disclosed subject matter. As shown in FIG. 5B, graph 500*b* may include a vertical axis of current density (J) (e.g., in amperes per square centimeter (A/cm²)) and a horizontal axis of voltage (e.g., in volts (V)).

As shown in FIG. 5B, first curve 501*b* may represent a buried grid junction barrier Schottky diode with a single Schottky material layer, and second curve 502*b* may represent a buried grid double junction barrier Schottky diode (e.g., with two Schottky material layers with different Schottky barrier heights), as described herein. Second curve 502*b* may demonstrate a lower threshold voltage (VTH) compared to first curve 501*b*. Additionally, at the rated current density, second curve 502*b* may demonstrate a lower forward voltage drop ($V_F$) compared to first curve 501*b*.

In some non-limiting embodiments or aspects, the buried grid double junction barrier Schottky diode described herein may reduce the area (and/or production cost) compared to a diode with a single Schottky material layer and still have the same forward voltage drop ($V_F$) at the rated current.

Figure 6:
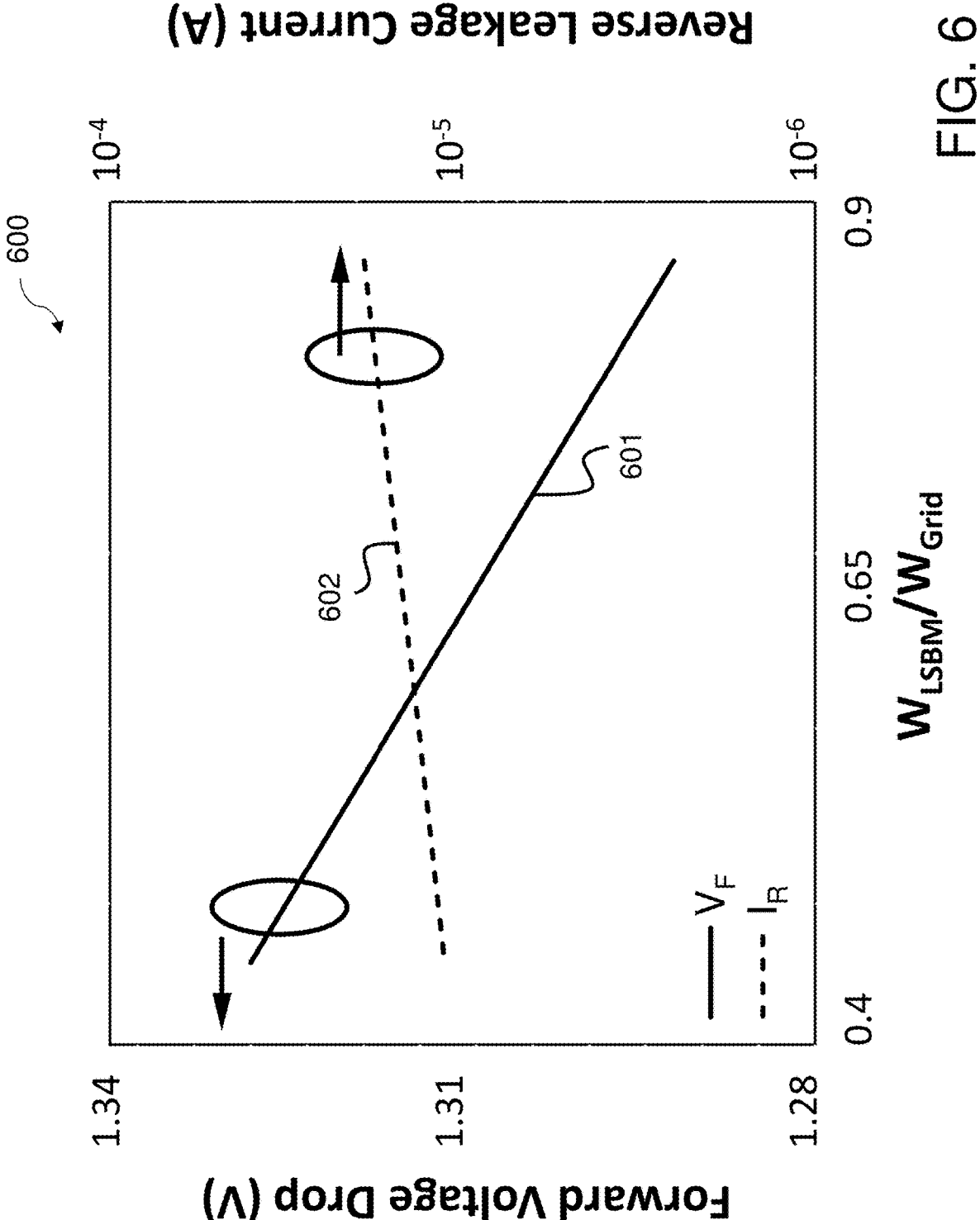
FIG. 6 is a graph of the ratio of the width of the first Schottky material layer to the width of the grid segments, forward voltage drop, and leakage current of an exemplary implementation of a buried grid double junction barrier Schottky diode, according to some non-limiting embodiments or aspects of the presently disclosed subject matter.

Referring now to FIG. 6, FIG. 6 shows graph 600 of the ratio of the width of the first Schottky material layer to the width of the grid segments ($W_{LSBM}/W_{Grid}$), forward voltage drop ($V_F$), and leakage current ($I_R$) of an exemplary implementation of a buried grid double junction barrier Schottky diode, according to some non-limiting embodiments or aspects of the presently disclosed subject matter. As shown in FIG. 6, graph 600 may include a left vertical axis of forward voltage drop ($V_F$) (e.g., in volts (V)) at rated current, a right vertical axis of leakage current ($I_R$) (e.g., in amperes (A)) at rated voltage, and a horizontal axis of the ratio of the width of the first Schottky material layer (e.g., LSBM layer) to the width of the grid segments ($W_{LSBM}/W$ Grid). As shown in FIG. 6, the left vertical axis may include a linear scale, and the right vertical axis may include a logarithmic scale.

As shown in FIG. 6, first curve 601 may represent a forward voltage drop ($V_F$) and second curve 602 may represent a leakage current ($I_R$) of a buried grid double junction barrier Schottky diode (e.g., with two Schottky material layers with different Schottky barrier heights (e.g., 1 eV as LSBM and 1.22 eV as HSBM)), as described herein. As shown in FIG. 6, there is a tradeoff between forward voltage drop ($V_F$) and leakage current ($I_R$) depending on the width of the LSBM layer segments compared to the width of the grid segments of the grid layer (e.g., the ratio $W_{LSBM}/W_{Grid}$). For example, increasing the width of the LSBM layer may reduce the forward voltage drop ($V_F$) but may increase the leakage current ($I_R$). Decreasing the width of the LSBM layer may increase the forward voltage drop ($V_F$) but may reduce the leakage current ($I_R$).

In some non-limiting embodiments or aspects, the width of the LSBM layer (e.g., relative to the width of the grid segments) may be selected based on a target forward voltage drop ($V_F$), a target leakage current ($I_R$), any combination thereof, and/or the like. Additionally or alternatively, the Schottky barrier height of at least one of the LSBM layer and/or the HSBM layer may be adjusted (e.g., by selecting a different material and/or by applying a different surface treatment) based on a target forward voltage drop ($V_F$), a target leakage current ($I_R$), any combination thereof, and/or the like (e.g., and the width of the LSBM may be kept the same).

In some non-limiting embodiments or aspects, the second Schottky material layer (e.g., HSBM layer) may cover all areas (e.g., of the regrown layer) not covered by the segments of the first Schottky material layer (e.g., LSBM layer).

Although the disclosed subject matter has been described in detail for the purpose of illustration based on what is currently considered to be the most practical and preferred embodiments or aspects, it is to be understood that such detail is solely for that purpose and that the disclosed subject matter is not limited to the disclosed embodiments or aspects, but, on the contrary, is intended to cover modifications and equivalent arrangements that are within the spirit and scope of the appended claims. For example, it is to be understood that the presently disclosed subject matter contemplates that, to the extent possible, one or more features of any embodiment or aspect can be combined with one or more features of any other embodiment or aspect.

What is claimed is:

1. A buried grid double junction barrier Schottky diode, comprising:

a drift layer;

a grid layer comprising a plurality of grid segments at least partially in the drift layer, the plurality of grid segments defining at least one grid spacing area between adjacent grid segments of the plurality of grid segments;

a regrown layer on the grid layer and the drift layer, wherein the grid layer and the drift layer are disposed on a first side of the regrown layer;

a first Schottky material layer at least partially on the regrown layer and at least partially overlapping the plurality of grid segments of the grid layer, wherein the first Schottky material layer is disposed on a planar surface of a second side of the regrown layer opposite the first side; and a second Schottky material layer at least partially on the regrown layer and at least partially overlapping the at least one grid spacing area, the second Schottky material layer having a different Schottky barrier height than the first Schottky material layer, wherein the second Schottky material layer is disposed on the planar surface of the second side of the regrown layer opposite the first side.

2. The buried grid double junction barrier Schottky diode of claim 1, further comprising:

a substrate layer, wherein the substrate layer is below the drift layer.

3. The buried grid double junction barrier Schottky diode of claim 2, further comprising:

a metallization layer, wherein the substrate layer is on the metallization layer.

4. The buried grid double junction barrier Schottky diode of claim 2, further comprising:

a buffer layer on the substrate layer, wherein the drift layer is on the buffer layer.

5. The buried grid double junction barrier Schottky diode of claim 1, wherein a top surface of the grid layer is in a plane, a top surface of the drift layer is in the plane, and the regrown layer is on the top surface of the grid layer and the top surface of the drift layer.

6. The buried grid double junction barrier Schottky diode of claim 1, wherein the second Schottky material layer has a higher Schottky barrier height than the first Schottky material layer.

7. The buried grid double junction barrier Schottky diode of claim 1, wherein the first Schottky material layer is on the second Schottky material layer, and the second Schottky material layer is at least partially in the first Schottky material layer.

8. The buried grid double junction barrier Schottky diode of claim 1, wherein the second Schottky material layer is on the first Schottky material layer, and the first Schottky material layer is at least partially in the second Schottky material layer.

9. The buried grid double junction barrier Schottky diode of claim 1, wherein at least one of the first Schottky material layer or the second Schottky material layer comprises an anode, the buried grid double junction barrier Schottky diode further comprising:

a cathode on an opposite side of the drift layer from the anode.

10. The buried grid double junction barrier Schottky diode of claim 9, wherein the buried grid double junction barrier Schottky diode operates in a current conducting mode when a positive voltage greater than a threshold voltage is applied from the anode to the cathode, and wherein the buried grid double junction barrier Schottky diode operates in a voltage blocking mode when a negative voltage is applied from the anode to the cathode.

11. The buried grid double junction barrier Schottky diode of claim 1, further comprising:

an anode at least partially on at least one of the first Schottky material layer or the second Schottky material layer; and a cathode on an opposite side of the drift layer from the anode.

12. The buried grid double junction barrier Schottky diode of claim 1, wherein the first Schottky material layer comprises a plurality of segments, each respective segment of the first Schottky material layer at least partially overlapping a respective grid segment of the plurality of grid segments of the grid layer.

13. The buried grid double junction barrier Schottky diode of claim 12, wherein a width of each respective segment of the first Schottky material layer is less than a width of the respective grid segment of the plurality of grid segments of the grid layer.

14. The buried grid double junction barrier Schottky diode of claim 12, wherein a width of each respective segment of the first Schottky material layer is greater than or equal to a width of the respective grid segment of the plurality of grid segments of the grid layer.

15. The buried grid double junction barrier Schottky diode of claim 1, wherein the at least one grid spacing area comprises a plurality of grid spacing areas, and wherein the second Schottky material layer comprises a plurality of segments, each respective segment of the second Schottky material layer at least partially overlapping a respective grid spacing area of the plurality of grid spacing areas.

16. The buried grid double junction barrier Schottky diode of claim 15, wherein one of:

a width of each respective segment of the second Schottky material layer is less than a width of the respective grid spacing area of the plurality of grid spacing areas, or the width of each respective segment of the second Schottky material layer is greater than or equal to the width of the respective grid spacing area of the plurality of grid spacing areas.

17. A method of making a buried grid double junction barrier Schottky diode, comprising:

forming a drift layer;

forming a grid layer comprising a plurality of grid segments at least partially in the drift layer, the plurality of grid segments defining at least one grid spacing area between adjacent grid segments of the plurality of grid segments;

forming a regrown layer on the grid layer and the drift layer, wherein the grid layer and the drift layer are disposed on a first side of the regrown layer;

forming a first Schottky material layer at least partially on the regrown layer and at least partially overlapping the plurality of grid segments of the grid layer, wherein the first Schottky material layer is disposed on a planar surface of a second side of the regrown layer opposite the first side; and forming a second Schottky material layer at least partially on the regrown layer and at least partially overlapping the at least one grid spacing area, the second Schottky material layer having a different Schottky barrier height than the first Schottky material layer, wherein the second Schottky material layer is disposed on the planar surface of the second side of the regrown layer opposite the first side.

18. The method of claim 17, further comprising:

providing a substrate layer; and forming a buffer layer on the substrate layer, wherein forming the drift layer comprises forming the drift layer on the buffer layer.

19. The method of claim 18, wherein forming the first Schottky material layer comprises:

forming an intermediate first Schottky material layer on the regrown layer; and patterning the intermediate first Schottky material layer to form the first Schottky material layer at least partially overlapping the plurality of grid segments of the grid layer, wherein forming the second Schottky material layer comprises forming the second Schottky material layer on the first Schottky material layer.

20. The method of claim 18, wherein forming the second Schottky material layer comprises:

forming an intermediate second Schottky material layer on the regrown layer; and patterning the intermediate second Schottky material layer to form the second Schottky material layer at least partially overlapping the at least one grid spacing area, wherein forming the first Schottky material layer comprises forming the first Schottky material layer on the second Schottky material layer.

* * * * *